United States Patent [19]

Scherer

[11] Patent Number: 4,768,077
[45] Date of Patent: Aug. 30, 1988

[54] LEAD FRAME HAVING NON-CONDUCTIVE TIE-BAR FOR USE IN INTEGRATED CIRCUIT PACKAGES

[75] Inventor: Jeremy D. Scherer, South Dartmouth, Mass.

[73] Assignee: Aegis, Inc., New Bedford, Mass.

[21] Appl. No.: 870,949

[22] Filed: Feb. 20, 1986

[51] Int. Cl.[4] .................... H01L 23/48; H01L 23/14
[52] U.S. Cl. ........................ 357/70; 357/80; 357/68
[58] Field of Search ............... 357/70, 80, 68; 174/52 FP

[56] References Cited

U.S. PATENT DOCUMENTS

| | | | |
|---|---|---|---|
| 3,325,882 | 6/1967 | Chiou et al. | 357/80 |
| 3,436,604 | 4/1969 | Hyltin et al. | 357/80 |
| 3,550,766 | 12/1970 | Nixen et al. | 357/70 |
| 3,628,105 | 12/1971 | Sakai et al. | 357/80 |
| 3,689,336 | 9/1972 | Bunker et al. | |
| 3,871,068 | 3/1975 | Booth | 357/70 |
| 4,034,149 | 7/1977 | Zaleckas | 357/80 |
| 4,155,615 | 5/1979 | Zimmerman, Jr. et al. | 357/80 |
| 4,411,719 | 10/1983 | Lindberg . | |
| 4,432,839 | 2/1984 | Kline . | |
| 4,459,189 | 7/1984 | Vance et al. . | |
| 4,479,298 | 10/1984 | Hug . | |
| 4,547,795 | 10/1985 | Wulff | 357/70 |

OTHER PUBLICATIONS

Grechus et al–"Lead Frame Bonding"–Western Electric Technical Digest–Apr. 1975, No. 38, pp. 13–14.

*Primary Examiner*—Andrew J. James
*Assistant Examiner*—S. V. Clark
*Attorney, Agent, or Firm*—Banner, Birch, McKie & Beckett

[57] ABSTRACT

The present invention is directed to a lead frame having both electrically conductive and electrically non-conductive tie-bar portions. The electrically conductive tie-bar portion allows the attached leads to be simultaneously electroplated, yet is removable from the lead frame, leaving the electrically non-conductive tie-bar portion which provides support for the leads. The advantages to the electrically non-conductive tie-bar portion include substantially decreasing the leads' bending and/or breaking from the package, during both manufacturing and/or testing of the integrated circuit.

30 Claims, 2 Drawing Sheets

LEAD FRAME HAVING NON-CONDUCTIVE TIE-BAR FOR USE IN INTEGRATED CIRCUIT PACKAGES

BACKGROUND OF THE INVENTION

1. Technical Field

The present invention relates to lead frames typically used with packaged integrated circuits, and more particularly to the tie-bar portion of the lead frames wherein the tie-bar includes a non-conductive portion for use in the production and/or testing of microcircuits.

2. Background Information

Typically, as is known in the art that integrated circuits and microcircuits, such as transistor-transistor logic (TTL), emitter-coupled logic (ECL), hybrid circuits, and the like, are hermetically sealed either in flat packages, such a T- or W-type, or in dual-in-line packages, such as ceramic or plastic. See e.g., Texas Instruments, Inc., *The TTL Data Book For Design Engineers* § 4 (2d ed. 1981). In order to electrically contact the packaged microcircuit from the exterior of the package, metallized leads are integrated into the package to provide an electrically conductive path to the circuit.

Examples of the lead frame and packaged metallized leads are shown with references to FIGS. 1 through 3. In FIG. 1, a typical metallized lead frame 10 for use in an integrated circuit package is shown, wherein leads 11 are attached to tie-bar 12. The tie-bar typically has at least one hole 13, allowing the lead frame to be secured while leads 11 are attached to a package body. In FIG. 2, a typical metal integrated circuit package is shown with dual lead frames 21a and 21b extending through two opposite sides of package body 22. In FIG. 3, a typical ceramic microcircuit package is shown with dual lead frames 31a and 31b attached to package body 32. The package leads are typically made of KOVAR ® (military specification F-15), 42 alloy, or other similar materials.

As is well known in the art, the tips of the leads of the lead frame used in a metal integrated circuit package serve as the bonding pads on the interior of the package. In a ceramic package, the tips of the leads are attached to a metallized path which extends from the package interior to its exterior.

After a package is manufactured, the metal portions of the package are typically plated to protect against corrosion. Additionally, the lead frames are plated with an easily weldable, solderable, or bondable material, such as gold or silver, for aiding in attachment to the pads and soldering or welding to the leads. The platings are most typically applied electrically. To allow all leads on the tie-bar to be electroplated at the same time, the tie-bar remains attached to the adjoining leads, thereby providing electrical contact to all respective leads.

After electroplating the leads, the microcircuit is inserted and wire bound to the package's bonding pads. Typically, tests are conducted on the microcircuit, especially when a new design is being developed. To test the circuit, the electrically-conductive tie-bar must be removed. During the manufacture of a new microcircuit design, such as a hybrid microcircuit, the device is often tested repeatedly, with repairs and/or modifications made while testing and troubleshooting. Tests are performed typically after every phase of completion. For example, conductivity testing is done during the assembly, and dynamic testing is done at the completion of the integrated circuit. The leads on these microcircuit packages are typically 0.010 inches thick and 0.015 inches wide. Accordingly, they are highly fragile and bend easily. Repeated minor bending of the lead often causes breakage.

A broken lead causes many problems. Many specifications limit the number of times that a microcircuit, such as a hybrid, can be repaired. Additionally, transferring the circuit from one package to another is either against specifications or impractical due to the number of wire bonds that are involved.

SUMMARY OF THE INVENTION

Accordingly, an object of the present invention is to provide a tie-bar arrangement for the lead frame which solves the problem of leads breaking off of the microcircuit package either during the manufacturing of or during the testing and/or troubleshooting of the integrated circuit.

Another object of the present invention is to provide a tie-bar arrangement for a lead frame, wherein the tie-bar arrangement includes both an electrically conductive and an electrically non-conductive portion with respect to all attached leads, and further, wherein the tie-bar portions are severable, thereby electrically isolating the leads on the lead frame from one another.

The present invention is directed to solve the problems of the prior art by a lead frame having both electrically conductive and electrically non-conductive tie-bar portions. The electrically conductive tie-bar portion allows the attached leads to be simultaneously electroplated, yet is removable from the lead frame, leaving the electrically non-conductive tie-bar portion which provides support for the leads.

The advantages to the electrically non-conductive tie-bar portion are obvious to those skilled in the art, and include substantially decreasing the leads' bending and/or breaking from the package, during both manufacturing and/or testing of the integrated circuit.

DESCRIPTION OF THE PREFERRED EMBODIMENT

Figure 4:
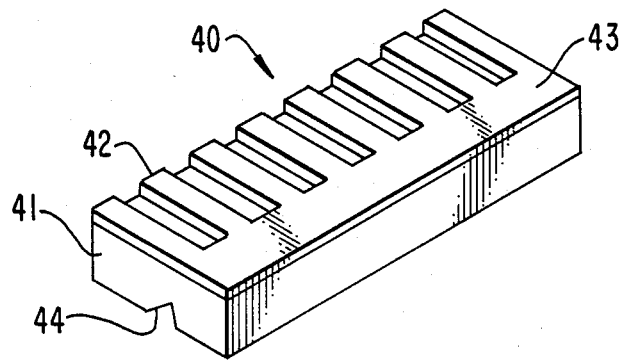
FIG. 4 is an isometric view of the tie-bar arrangement of the present invention.

Turning now to FIG. 4, isometric view of the tie-bar arrangement of the present invention is shown. Tie-bar arrangement 40 includes solid base 41, to which metallized lead segments 42 and connective strip 43 are adhered. The spacing and widths of segments 42 are preferably identical to the spacing and widths of leads 11 of FIG. 1. Solid base 41 also includes notch 44, for easily separating connective strip 43 from metallized segments 42.

In the preferred embodiment, solid base 41 comprises a ceramic material. Although almost any ceramic material can be used, it is preferable to use an alumina (Al₂O₃) compound, and more preferably to use an alumina compound having at least 92% alumina. This material is preferred because it is both inexpensive and its coefficient of thermal expansion is very close to that of KOVAR ®, the typical package material. In applications where KOVAR ® is not the package material, it follows that the ceramic material should be chosen on the basis of matching the thermal expansion coefficients.

Metallized segments 42 and connective strip 43 can be any metal compound, such as moly-magenese or tungsten. In the preferred embodiment, the metallized segments and connective strip are tungsten, which is co-fired to the ceramic base for adhesion thereto. To aid in brazing the metallized lead segments and the lead frame, it is preferable to include a layer of electroplated material (not shown), preferably nickel, over the metallization. Although other electroplating materials are known in the art, nickel is preferred because it is inexpensive and takes a braze easily.

Figure 1:
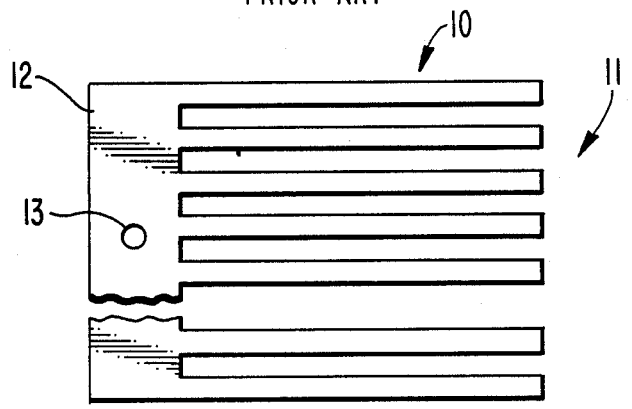
FIG. 1 is a typical metallized lead frame.
Figure 2:
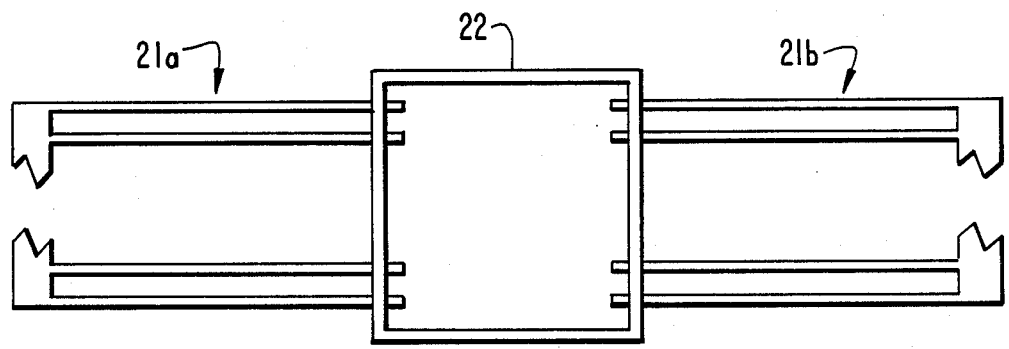
FIG. 2 is a typical metal microcircuit package with dual metallized lead frames.
Figure 3:
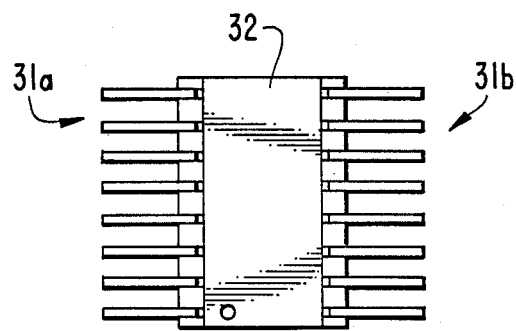
FIG. 3 is a typical ceramic microcircuit package with dual metallized lead frames.

The above materials are chosen to withstand the temperatures of the package manufacturing process, including any subsequent heating procedures to detect defective packages and/or circuits ("burn in") for the tie-bar arrangement of FIG. 4, which will be used in conjunction with the metallized lead frame of FIG. 1 throughout the manufacturing process. Other materials, well-known to those skilled in the art, can be used for the base, metallized segments, and electroplating layer.

The tie-bar arrangement of FIG. 4 is used with the metallized leads of the lead frame of FIG. 1 to produce a lead frame having a tie-bar arrangement that is initially electrically conductive with respect to the attached leads, allowing the leads to be simultaneously electroplated, and subsequently electrically non-conductive, allowing a microcircuit attached to the leads to be tested. The solid base underlying the non-conductive portion of the tie-bar arrangement provides a support structure for the leads, substantially decreasing the probability of a lead bending and/or breaking during the manufacturing and/or testing of the intergrated circuit package.

Figure 5:
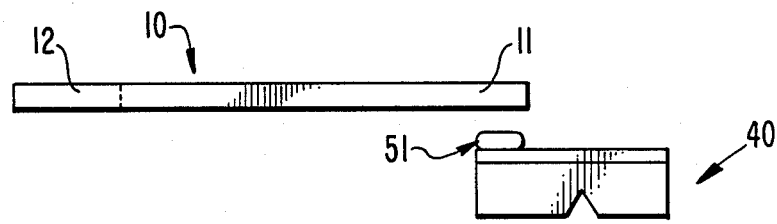
FIG. 5 shows the bonding of the metallized lead frame of FIG. 1 to the tie-bar arrangement of FIG. 4.
Figure 6:
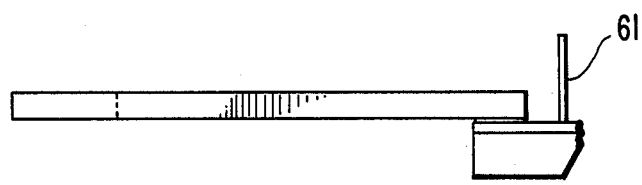
FIG. 6 shown an optional metallized pin attached to the lead frame's electrically non-conductive portion of the tie-bar.

With reference to FIGS. 5 and 6, the preferred process of manufacturing the lead frame utilizing the tie-bar arrangement of the present invention will now be described.

Turning now to FIG. 5, the bonding of metallized lead frame 10 of FIG. 1 to tie-bar arrangement 40 of FIG. 4 is shown. Braze 51 is applied to the extreme ends of metallized segments 42, and lead frame 10 is laid on top of the extreme ends over the braze. The structure is heated, causing the braze to flow and wet both adjoining surfaces, thereby bonding them upon sufficient cooling of the braze. In the preferred embodiment, braze 51 is copper, although other materials, well known to those in the art, can be used. Copper is preferred because it has a melting point higher than that of the glass composition used with typical microcircuit packages.

After the lead frame and the tie-bar arrangement are joined, the lead frame's tie-bar 12 is removed from leads 11, producing a lead frame having leads and a tie-bar arrangement that is initially electrically conductive, but can subsequently be electrically non-conductive by removing the connective strip, as discussed in detail below. The lead frame can then be used in the manufacture of an integrated circuit package, a technique well known to those skilled in the art. Once so used, the leads can be easily electroplated, because the leads are electrically connected to each other by connective strip 43. The microcircuit can then be wire-bound to the pads of the leads, and the circuit can be tested.

At any time prior to microcircuit testing, connective strip 43 is removed by applying pressure, such as a shearing force, at notch 44 in the tie-bar arrangement. Although the leads are electrically insulated from each other, the underlying contiguous base provides the support for the leads, reducing their bending and/or breaking during testing and handling.

Testing is done by making electrical contact to appropriate metallized segments or leads, as required. Optionally, metallized pins 61, shown in FIG. 6, could be attached to the the segments of the tie-bar arrangement. The pins could optionally be electroplated to reduce corrosion. The pins, which would remain with the non-conductive portion of the tie-bar arrangement when the connective strip is detached, could be plugged into inexpensive conventional sockets for testing the packaged microcircuit. Using conventional sockets would eliminate the need for more expensive zero-insertion-force test sockets.

Alternatively, if the testing hardward requires edge-connectors, the tie-bar arrangement could be dimensioned to provide the appropriate thickness and width for insertion into the edge-connectors. This, too, would save the cost of zero-insertion-force test fixtures.

Various modifications can be made to the above tie-bar arrangement and method of manufacturing the lead frame utilizing the tie-bar arrangement while achieving the same results, as will be apparent to those skilled in the art.

For example, the notch, which preferably runs the entire width of the base, can be segmented or replaced with other means for aiding in the removal of the conductive portion of the tie-bar, such as perforations. Other means will be obvious to those skilled in the art.

Additionally, the tie-bar arrangement of FIG. 4 can be manufactured without the electrically conductive connective strip. The integrated circuit package would be manufactured as in the prior art, and the electrically non-conductive tie-bar portion would be attached to the leads any time before circuit testing. The truncated tie-bar would be attached (soldered or brazed) near the tie-bar of the metallized lead frame. The lead frame's electrically conductive tie-bar would be removed, leaving the supportive electrically non-conductive tie-bar. By attaching the truncated non-conductive tie-bar to the lead frame after the package is manufactured, conventional thick film paste, containing glass, can be used in place of the high temperature metallization, because thick film paste cannot usually withstand the typical manufacturing temperatures. However, the use of this type of tie-bar would be disadvantageous in that the material comprising the conductive tie-bar of the original lead frame would also be required, as well as electroplated, and this represents added expense.

Very often, gold or silver is required as the electroplating material. Because the conductive tie-bar is removed after electroplating, the electroplate material on the scrap tie-bar would be economically wasted. To prevent the waste from occurring when the tie-bar arrangement of FIG. 4 is used, the metallization layer on the connective strip of the tie-bar arrangement could be overscreened, for example with a dielectric or a laminate such as ceramic, so that only the exposed areas would be electroplated. Because the connective strip would not be plated, no electroplating material would be wasted on the connective strip. Electroplating the lead frame, as is typical in the art, comprises attaching an electrical lead to the connective strip and connecting the electrical lead to a first voltage potential. The lead frame is submerged in the electroplating solution, which is at a second voltage potential. Due to the difference in potentials, the electroplating material is attached to the connective strip, thereby coating the leads attached to the lead frame with the electroplating material. Because the connective strip is overscreened, no electroplating material adheres to it. The attached electrical lead, however, insures electrical contact with all of the leads on the lead frame, thereby electroplating the leads of the lead frame.

Although illustrative embodiments of the present invention have been described in detail with reference to the accompanying drawings, it is to be understood that the invention is not limited to those precise embodiments. Various changes or modifications may be effected therein by one skilled in the art without departing from the scope or spirit of the invention.

What I claim is:

1. A lead frame for use in integrated circuit packages, the lead frame including a plurality of parallel metallized leads, each lead spaced a predetermined spacing from each other and having a predetermined width, and a tie-bar attached to the leads near the extremity of the leads, said tie-bar comprising:
   an electrically non-conductive base;
   a plurality of parallel metallized segments attached to the top of said base, said segments substantially corresponding to the predetermined spacing and width of the leads; and
   a metallized connective strip attached to the top of said base in a direction perpendicular to the direction of said segments, electrically connecting said segments to each other.

2. The lead frame of claim 1 wherein said non-conductive base includes means for aiding in the removal of said connective strip upon the application of a shearing force.

3. The lead frame of claim 2 wherein said means for aiding inludes a notch on the bottom of said base, said notch located in the same direction as said connective strip.

4. The lead frame of claim 3 wherein the length of said notch is substantially the length of said connective strip.

5. The lead frame of claim 3 wherein the length of said notch is substantially the length of said base.

6. The lead frame of claim 1 wherein said tie-bar further comprises a layer of electroplating on said segments.

7. The lead frame of claim 6 wherein said connective strip is overscreened with an electrically non-conductive material to prevent the electroplating of said connective strip.

8. The lead frame of claim 6 wherein said tie-bar further comprises a layer of electroplating on said connective strip.

9. The lead frame of claim 1 wherein said tie-bar further comprises a plurality of metallized pins attached in an upright fashion to said metallized segments, said pin spacing substantially corresponding to the insertion-hole spacing of an integrated circuit socket.

10. The lead frame of claim 9 wherein said pins further comprise a layer of electroplating.

11. The lead frame of claim 1 wherein the height of said tie-bar substantially corresponds to the insertion tolerance height of an edge-connector.

12. A tie-bar for use in a lead frame, the lead frame also including a plurality of parallel metallized leads, each lead having a predetermined spacing and width, said tie-bar comprising:
    an electrically non-conductive base;
    a plurality of parallel metallized segments attached to the top of said base, said segments substantially corresponding to the predetermined spacing and width of the leads; and
    a metallized connective strip attached to the top of said base in a direction perpendicular to the direction of said segments, electrically connecting said segments to each other.

13. The tie-bar of claim 12 wherein said non-conductive base includes means for aiding in the removal of said connective strip upon the application of a shearing force.

14. The tie-bar of claim 13 wherein said means for aiding includes a notch on the bottom of said base, said notch located in the same direction as said connective strip.

15. The tie-bar of claim 14 wherein the length of said notch is substantially the length of said connective strip.

16. The tie-bar of claim 14 wherein the length of said notch is substantially the length of said base.

17. The tie-bar of claim 12 wherein said tie-bar further comprises a layer of electroplating on said segments.

18. The tie-bar of claim 17 wherein said connective strip is overscreened with an electrically non-conductive material to prevent the electroplating of said connective strip.

19. The tie-bar of claim 17 wherein said tie-bar further comprises a layer of electroplating on said connective strip.

20. The tie-bar of claim 12 wherein said tie-bar further comprises a plurality of metallized pins attached in an upright fashion to said metallized segments, said pin spacing substantially corresponding to the insertion-hole spacing of an integrated circuit socket.

21. The tie-bar of claim 20 wherein said pins further comprise a layer of electroplating.

22. The tie-bar of claim 12 wherein the height of said tie-bar substantially corresponds to the insertion tolerance height of an edge-connector.

23. A tie-bar arrangement for use with a lead frame of an integrated circuit package, said lead frame having a plurality of leads, said tie-bar arrangement comprising:
    an electrically nonconductive base region;
    a plurality of lead segment means fixedly disposed on a first portion of said base region for receiving at least some of said plurality of leads and for fixedly attaching at least some of said plurality of leads to said first portion of said base region;
    connection means fixedly disposed on a second portion of said base region for electrically connecting at least some of said plurality of lead segment means to one another; and
    wherein said connection means and said second portion of said base region are separable from said first portion of said base region and said lead segment means to cause said leads to be electrically disconnected from one another.

24. The tie-bar arrangement of claim 23 wherein said first portion of said base region provides a support structure for said leads.

25. In a lead frame for use with an integrated circuit package, said lead frame having a plurality of leads, a tie-bar arrangement for preventing damage to said leads and selectively electrically connecting said leads, said tie-bar arrangement comprising:

support means for supporting said leads;

lead segment means for receiving said leads and fixedly connecting said leads to a portion of said support means;

connection means for electrically connecting said lead segment means, said connection means being removably connected to said lead segment means.

26. The tie-bar arrangement of claim 25 wherein said support means comprises an electrically nonconductive base.

27. The tie-bar arrangement of claim 25 wherein said lead segment means and said connection means are substantially metallized.

28. The tie-bar arrangement of claim 26 wherein said lead segment means and said connection means are substantially metallized.

29. The tie-bar arrangement of claim 27 wherein said support means further comprises notch means for facilitating removal of said connection means from said lead segment means.

30. The tie-bar arrangement of claim 30 wherein said nonconductive base further comprises notch means for facilitating removal of said connection means from said lead segment means.

\* \* \* \* \*